United States Patent
Yu et al.

(10) Patent No.: US 7,573,061 B1
(45) Date of Patent: Aug. 11, 2009

(54) LOW-K SIC COPPER DIFFUSION BARRIER FILMS

(75) Inventors: Yongsik Yu, Lake Oswego, OR (US);
Karen Billington, Beaverton, OR (US);
Xingyuan Tang, West Linn, OR (US);
Haiying Fu, West Linn, OR (US);
Michael Carris, Taulatin, OR (US);
William Crew, Portland, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/893,490

(22) Filed: Aug. 15, 2007

Related U.S. Application Data

(63) Continuation of application No. 10/869,474, filed on Jun. 15, 2004, now Pat. No. 7,282,438.

(51) Int. Cl.
*H01L 35/24* (2006.01)
*H01L 51/00* (2006.01)

(52) U.S. Cl. .......................... 257/40; 257/751; 257/914; 257/E23.116; 257/E23.131; 257/E23.132; 257/E23.133; 257/E23.134

(58) Field of Classification Search .......... 438/637, 438/638, 627, 643, 653, 763, 931; 257/E21.579, 257/40, 751, 914, E23.116, E23.131, E23.132, 257/E23.133, E23.134
See application file for complete search history.

(56) References Cited

U.S. PATENT DOCUMENTS

| | | | |
|---|---|---|---|
| 4,177,474 A | 12/1979 | Ovshinsky | |
| 4,656,110 A | 4/1987 | Yamazaki | |
| 5,034,355 A | 7/1991 | Tani et al. | |
| 5,108,965 A | 4/1992 | Tani et al. | |
| 5,324,690 A | 6/1994 | Gelatos et al. | |
| 5,464,699 A | 11/1995 | Baldi | |
| 5,654,208 A | 8/1997 | Harris et al. | |
| 5,739,579 A | 4/1998 | Chiang et al. | |
| 5,958,324 A | 9/1999 | Bujalski et al. | |
| 6,045,877 A | 4/2000 | Gleason et al. | |
| 6,100,587 A | 8/2000 | Merchant et al. | |
| 6,159,871 A | 12/2000 | Loboda et al. | |
| 6,197,688 B1 | 3/2001 | Simpson | |
| 6,242,686 B1 | 6/2001 | Kishimoto et al. | |
| 6,352,945 B1 | 3/2002 | Matsuki | |

(Continued)

OTHER PUBLICATIONS

Masahiko Maeda, et al., "A Low-Permittivity Interconnection Using an SiBN Interlayer", Sep. 1989, IEEE Transactions on Electron Devices, vol. 36, No. 9.

(Continued)

*Primary Examiner*—Michelle Estrada
(74) *Attorney, Agent, or Firm*—Weaver Austin Villeneuve & Sampson LLP

(57) ABSTRACT

Copper diffusion barrier films having low dielectric constants are suitable for a variety of copper/inter-metal dielectric integration schemes. Copper diffusion barrier films in accordance with the invention are composed of one or more layers of silicon carbide, at least one of the silicon carbide layers having a composition of at least 40% carbon (C), for example, between about 45 and 60% carbon (C). The films' high carbon-content layer will have a composition wherein the ratio of C to Si is greater than 2:1; or >3:1; or >4:1; or >5.1. The high carbon-content copper diffusion barrier films have a reduced effective k relative to conventional barrier materials.

14 Claims, 4 Drawing Sheets

U.S. PATENT DOCUMENTS

| | | | |
|---|---|---|---|
| 6,383,898 B1 | 5/2002 | Kishimoto et al. | |
| 6,383,955 B1 | 5/2002 | Matsuki | |
| 6,399,484 B1 | 6/2002 | Yamasaki et al. | |
| 6,410,419 B1 * | 6/2002 | Merchant et al. | 438/628 |
| 6,417,092 B1 | 7/2002 | Jain et al. | |
| 6,424,044 B1 | 7/2002 | Han et al. | |
| 6,432,846 B1 | 8/2002 | Matsuki | |
| 6,670,715 B2 | 12/2003 | Yang et al. | |
| 6,764,958 B1 | 7/2004 | Nemani et al. | |
| 6,774,489 B2 | 8/2004 | Russell et al. | |
| 6,790,767 B2 | 9/2004 | Lee | |
| 6,790,788 B2 | 9/2004 | Li et al. | |
| 6,855,645 B2 | 2/2005 | Tang et al. | |
| 6,881,683 B2 | 4/2005 | Matsuki et al. | |
| 6,890,850 B2 | 5/2005 | Lee et al. | |
| 6,967,405 B1 | 11/2005 | Yu et al. | |
| 7,064,088 B2 | 6/2006 | Hyodo et al. | |
| 7,163,889 B2 | 1/2007 | Yu et al. | |
| 7,239,017 B1 | 7/2007 | Yu et al. | |
| 2003/0001275 A1 | 1/2003 | Sambucetti et al. | |
| 2003/0057553 A1 | 3/2003 | DelaRosa et al. | |
| 2003/0068881 A1 | 4/2003 | Xia et al. | |
| 2003/0082296 A1 | 5/2003 | Elers et al. | |
| 2003/0089992 A1 | 5/2003 | Rathi et al. | |
| 2003/0194496 A1 | 10/2003 | Xu et al. | |
| 2003/0232514 A1 | 12/2003 | Kim et al. | |
| 2004/0067308 A1 | 4/2004 | Zheng et al. | |
| 2004/0084774 A1 | 5/2004 | Li et al. | |
| 2004/0113279 A1 | 6/2004 | Chen et al. | |
| 2004/0124531 A1 | 7/2004 | Venkatraman et al. | |
| 2004/0207084 A1 | 10/2004 | Hedrick et al. | |
| 2005/0014361 A1 | 1/2005 | Nguyen et al. | |
| 2005/0042889 A1 | 2/2005 | Lee et al. | |
| 2005/0202685 A1 | 9/2005 | Huang et al. | |
| 2005/0233555 A1 | 10/2005 | Rajagopalan et al. | |
| 2005/0236711 A1 | 10/2005 | Wang et al. | |
| 2005/0245071 A1 | 11/2005 | Wu et al. | |
| 2005/0277302 A1 | 12/2005 | Nguyen et al. | |
| 2006/0019486 A1 | 1/2006 | Yu et al. | |
| 2006/0110931 A1 | 5/2006 | Fukazawa et al. | |
| 2008/0070396 A1 | 3/2008 | Budrevich et al. | |

OTHER PUBLICATIONS

Takashi Sugino, et al., "Synthesis of boron nitride film with low dielectric constant for its application to silicon ultralarge scale integrated semiconductors", 2001 Elsevier Science B.V., Diamond and Related Materials 1275-1379.

U.S. Office Action mailed Feb. 24, 2005, from U.S. Appl. No. 10/670,660.

U.S. Office Action mailed May 3, 2006, from U.S. Appl. No. 10/915,117.

Yu et al., "Low-K Sic Copper Diffusion Barrier Films", Novellus Systems, Inc., U.S. Appl. No. 10/869,474, filed Jun. 15, 2004, pp. 1-25.

Yu et al., "Boron-Doped SiC Copper Diffusion Barrier Films", Novellus Systems, Inc., U.S. Appl. No. 11/373,847, filed Mar. 8, 2006, pp. 1-22.

Yu et al., "Improved Diffusion Barrier and Etch Stop Films", U.S. Appl. No. 11/710,652, filed Feb. 22, 2007.

Wu et al., "Methods for Improving Performance of ODC Films With Dielectric Constant<4.0", U.S. Appl. No. 11/693,661.

Chattopadhyay et al., "Methods for Reducing UV and Dielectric Diffusion Barrier Interaction", U.S. Appl. No. 11/693,617.

Qingguo (Gordon) Wu et al., "Ultra Low k Dielectrics Prepared by PECVD Using a Single-Precursor and Treated by UV Assisted Thermal Processing", Oct. 17-19, 2006, Advanced Metallization Conference (AMC) 2006, San Diego, CA, pp. 1-6.

U.S. Office Action mailed Sep. 6, 2006, from U.S. Appl. No. 10/869,474.

U.S. Office Action mailed Sep. 7, 2006, from U.S. Appl. No. 10/915,117.

U.S. Office Action mailed Dec. 11, 2006, from U.S. Appl. No. 10/915,117.

U.S. Office Action mailed Feb. 9, 2007, from U.S. Appl. No. 10/869,474.

U.S. Final Office Action, mailed Jun. 28, 2007, from U.S. Appl. No. 10/869,474.

U.S. Notice of Allowance, mailed Jul. 26, 2007, from U.S. Appl. No. 10/869,474.

U.S. Office Action dated May 1, 2008 for U.S. Appl. No. 11/373,847.

Notice of Allowance, mailed Jul. 1, 2008, Yu et al., "Baron-Doped SiC Copper Diffusion Barrier Films", U.S. Appl. No. 11/373,847.

Allowed Claims for U.S. Appl. No. 11/373,847.

* cited by examiner

LOW-K SIC COPPER DIFFUSION BARRIER FILMS

CROSS-REFERENCE TO RELATED APPLICATIONS

This application is a continuation of application Ser. No. 10/869,474 filed Jun. 15, 2004 now U.S. Pat. No. 7,282,438 and titled LOW-K SIC COPPER DIFFUSION BARRIER FILMS. The disclosure of this prior application is incorporated by reference herein in its entirety and for all purposes.

BACKGROUND

This invention relates to low dielectric constant layers for use in various applications. The invention also relates to methods of forming low dielectric constant layers in a wide range of VLSI and ULSI fabrication operations.

As the features of microelectronic integrated circuits devices are reduced to smaller sizes, the electrical properties of the materials that constitute the devices will require change and improvement. One material that must be improved is the electrical insulator ("dielectric") used between the wires, metal lines, and other elements of the circuit. Without improvement in the insulator material, there will be increased problems due to capacitive effects such as coupling (crosstalk) and propagation delay. The speed at which future circuits will operate will be limited by RC delay in the interconnect.

These difficulties can be mitigated by preparing the circuit using an inter-layer dielectric ("ILD"), for example an inter-metal dielectric ("IMD"), having a dielectric constant that is as low as possible. The integration of Cu metal and IMD with a low dielectric constant continues to challenge the integrated circuit industry as device size and wiring dimensions are scaled down. Low dielectric constant (k) ("low-k"), insulators, with k significantly lower than that of presently used $SiO_2$ (3.9), are needed for reducing capacitive coupling and improving switching performance of future ULSI circuits. In this regard, the effective dielectric constant ($k_{eff}$) encountered by the signal in the interconnect structure is the most important parameter.

Cu/IMD integration schemes typically involve the incorporation of other materials along with the bulk inter-metal dielectric material, forming a stack. These other materials may include copper diffusion barrier, copper capping layer and hardmask (e.g., CMP and etch stop) materials needed to prevent copper poisoning of the bulk low-k dielectric, to protect the relatively soft low-k dielectric, and to facilitate the Damascene processing used in the device fabrication. These materials have a substantial impact on the effective k of the IMD stack. Thus, the IMD must meet the dual challenges of minimizing the effective k of the stack while providing material selectivity with the use of reduced k etch stop, barrier and capping materials.

Silicon nitride (SiN) provides a film having satisfactory properties as a copper diffusion barrier, but its dielectric constant is relatively high. A recently developed PECVD SiC dielectric barrier is a promising candidate to replace SiN in many copper barrier applications because of its relatively low dielectric constant (k<4.5). However, existing PECVD SiC technology has shown limitations in achieving dielectric constants lower than 4.5 while continuing to maintain other integration requirements relating to line to line leakage, via poisoning, etch selectivity, Cu hillock formation and atmospheric moisture uptake. Improved materials and processing are required.

SUMMARY OF THE INVENTION

The present invention is mainly directed to copper diffusion barrier films having low dielectric constants suitable for a variety of copper/inter-metal dielectric integration schemes, and methods of making and using them in semiconductor devices. Copper diffusion barrier films in accordance with the invention are composed of one or more layers of silicon carbide, at least one of the silicon carbide layers having a composition of at least 40% carbon (C), for example, between about 45 and 60% carbon (C). The films' high carbon-content layer will have a composition wherein the ratio of C to Si is greater than 2:1; or >3:1; or >4:1; or >5.1. The copper diffusion barrier films maintain an effective dielectric constant of between about 2.8 and 3.9 in the presence of atmospheric moisture.

The copper diffusion barrier films of the invention may be composed of a single silicon carbide layer. According to this embodiment, a layer of undoped silicon carbide with a dielectric constant lower than 4, or even as low as 3 or lower, may be deposited as a copper diffusion barrier. Alternatively, the copper diffusion barrier films may be composed of multiple layers of silicon carbide having different compositions with a low effective dielectric constant, lower than 4 for example. The copper diffusion barrier film may have a thickness in the range of about 20 Å to 2000 Å.

In multi-layer copper diffusion barrier films of the invention, the composition of the layers may be tailored to provide additional functionality to the copper diffusion barrier film, and therefore to an IMD in which the copper diffusion barrier is incorporated. For example, nitrogen-doped silicon carbide and/or oxygen-doped silicon carbide layers may be incorporated into copper diffusion barrier film bi- or tri-layer stacks with undoped silicon carbide in accordance with the present invention to confer enhanced etch selectivity and moisture absorption blocking, respectively. While the dielectric constants of the individual oxygen- and, particularly, nitrogen-doped silicon carbide layers may be greater than 4, the much lower dielectric constant of the undoped silicon carbide portion of the barrier film can bring its overall k (effective k, $k_{eff}$) down below 4. In this way, the invention provides effective low-k IMD/Cu integration schemes.

Low-k copper diffusion barrier films in accordance with the invention may be formed by PECVD processes using relatively high carbon (C) content organosilicon precursors not previously used in this application. Precursors having a carbon composition of at least 40%, for example, between about 45 and 60% carbon (C) may be used. Suitable precursors may have at least 45%, 50% or 55% C and ratios of C:Si of at least 2:1 and as high as 5:1, or higher. In particular, organosilicon precursors such as ethynyltrimethylsilane, vinylphenylmethylsilane and phenyldimethylsilane, among others, may be used.

Other embodiments of the invention include a wholly or partially fabricated semiconductor device. The device includes a metal interconnect formed substantially of copper and a copper diffusion barrier adjacent the metal interconnect. The copper diffusion barrier is composed of one or more layers of silicon carbide, at least one of the silicon carbide layers having a composition of at least 40% carbon (C) and/or ratios of C:Si of at least 2:1 and as high as 5:1, or higher, as noted above. In some such devices, the copper diffusion barrier film may be composed of a single silicon carbide layer. In other such devices, the copper diffusion barrier films may be composed of multiple layers of silicon carbide having different compositions arranged to achieve effective low-k IMD/Cu integration schemes, as noted above.

Some aspects of the invention provide a method of forming at least a portion of a semiconductor device. The method includes the following operations: forming a trench in a first dielectric layer; forming a copper interconnect in the trench; and forming a copper diffusion barrier film on the copper interconnect, the copper diffusion barrier film comprising one or more layers of silicon carbide, at least one of the silicon carbide layers having a composition of at least 40% carbon (C) and/or ratios of C:Si of at least 2:1 and as high as 5:1, or higher, as noted above.

The step of forming a copper diffusion barrier film involves a plasma-enhanced chemical vapor deposition ("PECVD") process using one or more high carbon-content organosilicon precursor gases. The PECVD process may be performed in standard PECVD apparatus.

These and other features and advantages of the present invention will be described in more detail below with reference to the associated drawings.

DETAILED DESCRIPTION

Figure 1:
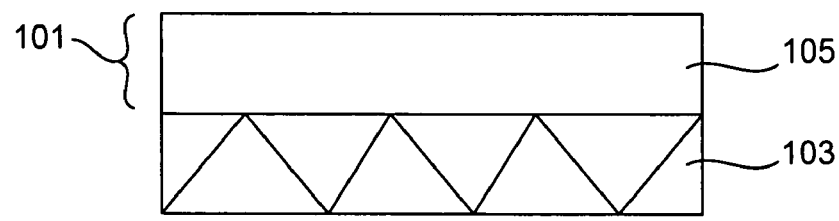
FIG. 1 illustrates a copper diffusion barrier film in accordance with an embodiment of the present invention.

In the following description, the invention is presented in terms of certain specific compositions, configurations, and processes to help explain how it may be practiced. The invention is not limited to these specific embodiments. Examples of specific embodiments of the invention are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the scope and equivalents of the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention is mainly directed to copper diffusion barrier films having low dielectric constants suitable for a variety of copper/inter-metal dielectric integration schemes, and methods of making and using them in semiconductor devices. Copper diffusion barrier films in accordance with the invention are composed of one or more layers of silicon carbide, at least one of the silicon carbide layers having a relatively carbon-rich composition of at least 40% carbon (C), for example, between about 45 and 60% carbon (C). The films' high carbon-content layer will have a composition wherein the ratio of C to Si is greater than 2:1; or >3:1; or >4:1; or >5.1. In preferred embodiments, the copper diffusion barrier films maintain an effective dielectric constant of between about 2.8 and 3.9 in the presence of atmospheric moisture.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

The copper diffusion barrier films of the invention may be composed of a single silicon carbide layer. Alternatively, the copper diffusion barrier films may be composed of multiple layers of silicon carbide having different compositions. Low-k copper diffusion barrier films may be formed by PECVD processes using novel organosilicon precursors not previously used in this application. In particular, organosilicon precursors such as ethynyltrimethylsilane, vinylphenylmethylsilane and phenyldimethylsilane, among others, may be used to achieve a barrier layer with a k as low as 3, or lower. In one embodiment, a layer of undoped silicon carbide with a dielectric constant lower than 4, or even as low as 3 or lower, may be deposited as a copper diffusion barrier. Alternatively, the copper diffusion barrier films may be composed of multiple layers of silicon carbide having different compositions with a is low effective dielectric constant, lower than 4 for example.

Barrier Films and Integration Schemes

The copper diffusion barrier films of the invention may be composed of a single silicon carbide layer. According to this embodiment, a layer of undoped silicon carbide with a dielectric constant as low as 3 may be deposited as a copper diffusion barrier. The copper diffusion barrier film may have a thickness in the range of about 20 Å to 2000 Å.

Crystalline SiC has a dielectric constant of >9.0 and the covalent Si—C bond can break very easily at high temperature leading to high leakage. However, excess hydrogen in PECVD deposited SiC films maintains discontinuity in the Si—C bonds and hence eliminates the leakage current problem at higher temperature and decreases the dielectric constant of PECVD deposited SiC films. Moreover, it has been discovered that low-k copper diffusion barrier films (e.g., undoped films with k less than about 3.6 (lower than that achievable using tetramethylsilane as a precursor) and as low as 3 or lower; and multilayer films with $k_{eff}$ less than 4 in many cases) may be formed by PECVD processes using carbon-rich organosilicon precursors not previously used in this application. In particular, organosilicon precursors such as ethynyltrimethylsilane, vinylphenylmethylsilane, phenyldimethylsilane, tri-iso-propylsilane, 3-(trimethylsilyl)cyclopentene, vinylphenyldimethylsilane and vinyldimethylsilane may be used.

Table 1 shows compositional data and the respective dielectric constants of various doped (oxygen-doped SiC (ODC); nitrogen-doped SiC (NDC)) and undoped silicon carbide (UDC) layers deposited using different precursors: tetramethysilane (MS); ethynyltrimethylsilane (ETMS), vinylphenylmethylsilane (VPMS) and phenyldimethylsilane (DMPS). NDC has a composition of Si, C, N and H. ODC has a composition of Si, C, O, H, while UDC has a composition of Si, C, and H.

TABLE 1

Film composition and k values of UDC, NDC, and ODC depending on precursors.

| Sample | Si | N | H | O | C | Dielectric constant (k) |
|---|---|---|---|---|---|---|
| 4MS_UDC | 0.24~0.26 | 0 | 0.38~0.4 | 0~0.03 | 0.30~0.37 | 3.6~4.0 |
| ETMS_UDC | 0.11~0.17 | 0 | 0.32~0.4 | 0~0.04 | 0.45 | 2.8~3.6 |
| VPMS_UDC | 0.09~0.11 | 0 | 0.32~0.34 | 0~0.02 | 0.54~0.56 | 3.0~3.6 |
| DMPS_UDC | 0.09~0.12 | 0 | 0.32~0.36 | 0~0.03 | 0.52~0.54 | 2.9~3.3 |
| 4MS_ODC | 0.26 | 0 | 0.24 | 0.2 | 0.3 | 4.4 |
| 4MS_NDC | 0.26 | 0.24 | 0.24 | 0 | 0.26 | 5.2 |

As the table shows, the precursors having at least 40% carbon (C), for example, between about 45 and 60% C (ETMS, VPMS and DMPS) produce undoped films having that same proportion of carbon which have a dielectric constant significantly lower than that of films formed with the conventional tetramethylsilane (4MS) precursor. While not shown in the table, the same is true for the doped variants using the high C-content precursors.

Barrier films in accordance with the invention are formed from these high carbon-content precursor materials in various configurations. The films will generally have at least one high carbon-content layer with a composition wherein the ratio of C to Si is greater than 2:1; or >3:1; or >4:1; or >5.1. Undoped and doped films formed from these materials provide improved performance as copper diffusion barrier films (and etch stops) over their conventional analogs as a result of their lower dielectric constants.

For example, undoped silicon carbide (UDC) barrier films deposited with these high carbon-content precursors have much lower k values and exhibit better etch selectivity to the via/line dielectric film due to the higher carbon content. These layers thus provide improved performance as copper diffusion barrier films (and etch stops) over conventional undoped films. FIG. 1 shows an example of a single layer barrier film 101 disposed on the surface of a copper layer 103, such as a metal line or via, in order to provide some context for how the film would be disposed when used in a semiconductor device. The film is composed of a layer of high C-content UDC 105 on the copper 103. Such a film may have a k as low as 3, or lower.

Moreover, the advantageous properties of doped SiC materials can be leveraged in accordance with the present invention to provide low-k copper barrier films with enhanced performance. In this regard, UDC is very low k and provides good etch selectivity, ODC layers block moisture absorption and NDC enhances etch selectivity. Amine free UDC and ODC processing can eliminate via poisoning caused by amine contamination of the low k material during damascene processing These layers, one or more of which having high carbon-content (and corresponding low-k) may be combined in a variety of configurations to form multi-layer, multi-functional (e.g., copper barrier, etch and/or CMP stop, moisture barrier) SiC barrier films depending on the particular integration scheme. The composition and configuration of the layers may be tailored to provide additional functionality to the SiC-based copper diffusion barrier film, and therefore to an IMD in which the copper diffusion barrier film is incorporated. While the dielectric constants of the individual nitrogen- and oxygen-doped silicon carbide layers is generally greater than 4, the much lower dielectric constant of the undoped silicon carbide portion of the barrier film brings its overall k (effective k, $k_{eff}$) down below 4. In this way, the invention provides effective low-k IMD/Cu integration schemes. Some examples of these multi-layer barrier films are illustrated in FIGS. 2A-2E.

Figure 2A:
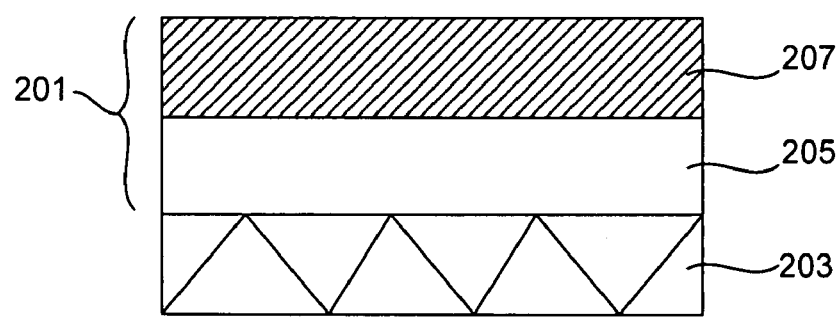
FIGS. 2A-E illustrate various configurations of copper diffusion barrier films in accordance with the present invention.

Referring to FIG. 2A, a UDC/ODC bi-layer copper diffusion barrier film in accordance with one embodiment of the present invention is shown. The barrier film 201 is shown disposed on the surface of a copper layer 203, such as a metal line or via, in order to provide some context for how the film would be disposed when used in a semiconductor device. The bi-layer film is composed of a layer of UDC 205 on the copper 203 and a layer of ODC 207 on the UDC. When the UDC layer 205 deposited between the freshly reduced Cu surface 203 and the ODC layer 207, it prevents the freshly reduced Cu surface from being re-oxidized by the ODC layer and promotes adhesion of the SiC film to the copper. The ODC layer blocks moisture absorption.

Since UDC and ODC films contain no amine (NH) source, the film will not cause any via poisoning during dual damascene integration. NDC films provide good etch selectivity to via/line dielectric films due to large compositional differences and good reliability due to stabilized Si—N and/or Si—C—N bonding. However, there are concerns that a NH₃-based process and/or a Nitrogen containing plasma based process such as NDC might result in via poisoning, and NDC films have shown higher k values than that of ODC or UDC films. It has been found that 200 Å or more of ODC or UDC layers are enough to prevent via poisoning no matter the thickness of the NDC layer.

Figure 2B:
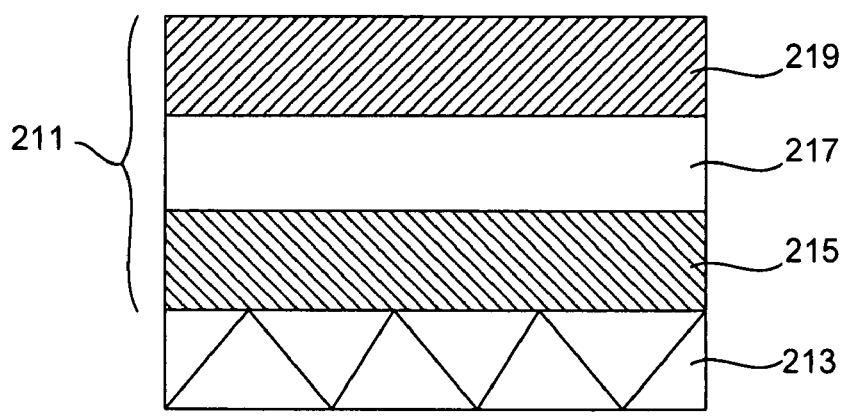

Referring the FIG. 2B, NDC/UDC/ODC tri-layer copper diffusion barrier film in accordance with one embodiment of the present invention is shown. The tri-layer film is composed of a layer of NDC 215 on the copper 203, a layer of UDC on the NDC and a layer of ODC 207 on the UDC. According to this scheme, the NDC layer 213 provides enhanced etch selectivity and the ODC layer blocks moisture absorption. the high carbon-content UDC layer 215 deposited in between confers low k on the entire stack.

Figure 2C:
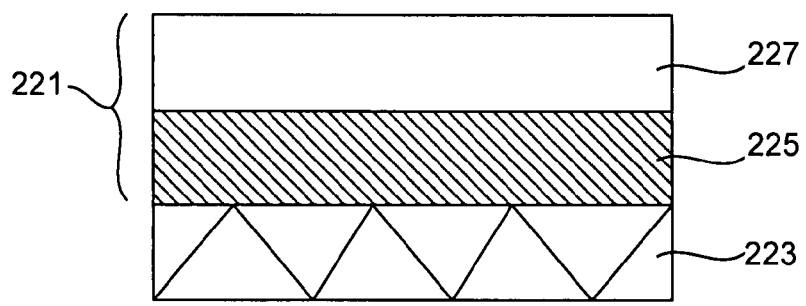
Figure 2D:
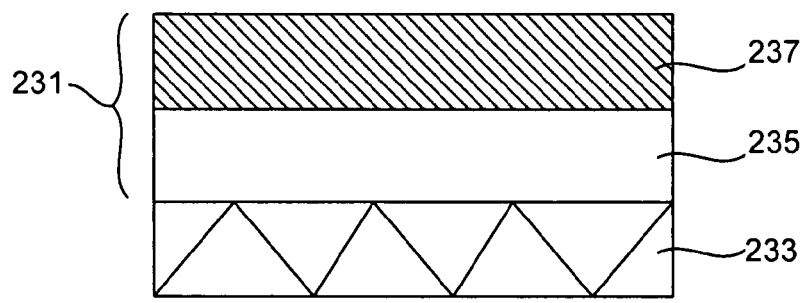
Figure 2E:
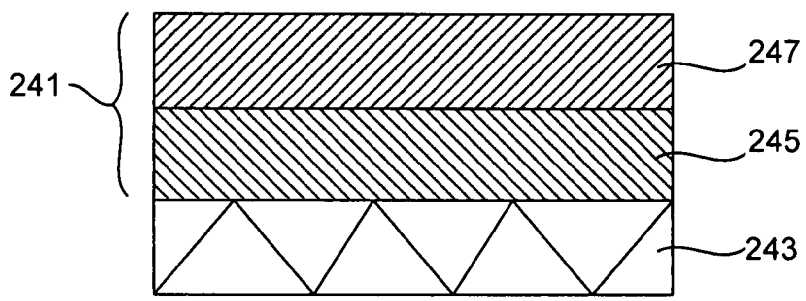

A variety of other multi-layered SiC configurations are illustrated in FIGS. 2C-2E:

FIG. 2C is a bi-layer film 221 that combines a first layer of NDC 225 on the surface of the copper 223 and a second layer of UDC 227 on the NDC 225. FIG. 2D is a bi-layer film that again combines UDC and NDC, but this time UDC forms the first layer 235 on the surface of the copper 233 and NDC the second layer 237 on the UDC. Both of these films combine the low-k and etch selectivity properties of NDC and UDC to form enhanced low-k barrier films.

FIG. 2E is a bi-layer film 241 that combines a first layer of NDC 245 on the surface of the copper 243 and a second layer of ODC 247 on the NDC 245. This film combines etch selectivity and moisture barrier properties of NDC and ODC to form an enhanced copper diffusion barrier film. Depending on the precursors used and the thicknesses of the layers this film may not have an effective dielectric constant quite as low as those barrier films incorporating UDC, but it may nevertheless find use in a number of integration schemes.

The thickness of each of the stack layer is determined by the application needs. The relative thickness of the NDC, ODC and/or UDC layers determines the k and the etch selectivity of the entire stack ($k_{eff}$). As noted above, the thickness of the film may be from about 20 to 2000 Å, for example about 500 Å. The relative thickness of the film layers may vary depending on the requirements of the integration. The k values of NDC, UDC, and ODC are precursor dependent and can be tuned by the stack combinations according to the overall performance considerations, such as are shown in Table 1, above, and FIGS. 3 and 4, below. In one specific embodiment, a UDC/ODC bi-layer with 150 Å of UDC followed by 350 Å of ODC provides a barrier film with $k_{eff}$<4. In another specific embodiment, a NDC/UDC bi-layer with 150 Å of NDC followed by 350 Å of UDC provides a barrier film with $k_{eff}$<3.5.

It has been found that the overall parametric performance for single layer and multi-layered barrier film stacks in accordance with the present invention is similar. Stress migration performance and electromigration lifetime is improved with multi-layer SiC barrier films.

The step of forming a copper diffusion barrier film involves a plasma-enhanced chemical vapor deposition ("PECVD") process conducted in a PECVD reactor. Conventional PECVD reactors are suitable for implementation of the present invention. The PECVD process may involve flowing an organosilicon precursor gas at rates in the range of approximately 50 to 2000 standard cubic centimeters per minute and/or a liquid precursor at rates in the range of approximately 0.3-5.0 ml per minute, for example, 0.5-3.0 ml/min, and flowing carrier gas e.g., He and/or $H_2$ and/or Ar in the range of approximately 0 to 9000 standard cubic centimeters per minute, for an undoped SiC (UDC) layer. An oxygen doped SiC (ODC) layer may be formed by additionally flowing up to 1000 sccm of $O_2$ and/or other oxygen source, such as $CO_2$. A nitrogen doped SiC (NDC) layer may be formed by additionally flowing up to 5000 sccm of nitrogen ($N_2$), ammonia ($NH_3$) or other nitrogen source. The PECVD process may be performed at temperatures in the range of approximately 200 to 425° C., at pressures in the range of approximately 0.1 torr to 10 torr (for example about 4-8 torr), at high frequency RF power of about 500-3000 W and low frequency RF power at 0-1000 W, and/or at frequencies in the range of approximately 200 to 500 kHz. Alternatively, the PECVD process may be performed at a frequency of approximately 13.56 MHz or 27 MHz.

The method may also include a pretreatment for removing copper oxide from the copper layer prior to forming the copper diffusion barrier on the copper layer. The pretreatment may involve exposing the copper layer to ammonia and/or hydrogen gas and/or helium and/or a nitrogen plasma. In some instances, a post-treatment may also be conducted, for example, exposing an oxygen-doped silicon carbide layer to $CO_2$ gas and/or $O_2$ plasma to condition the surface to optimally block moisture absorption.

Other embodiments of the invention include a wholly or partially fabricated semiconductor device. The device includes a metal interconnect formed substantially of copper and a copper diffusion barrier adjacent the metal interconnect. The copper diffusion barrier is formed of single or multi-layer silicon carbide films as described above. In some such devices, the copper diffusion barrier film may be composed of a single silicon carbide layer. In other such devices, the copper diffusion barrier films may be composed of multiple layers of silicon carbide having different compositions arranged to achieve effective low-k IMD/Cu integration schemes, as noted above.

Some aspects of the invention provide a method of forming at least a portion of a semiconductor device according to well known dual damascene fabrication techniques, but using the high carbon-content SiC precursors and integration schemes according to the present invention. The method includes the following steps: forming a trench in a first dielectric layer; forming a copper interconnect on the in the trench (which generally involves depositing a metal diffusion barrier in the trench and depositing a copper seed layer on the metal diffusion barrier); and forming a copper diffusion barrier in accordance with the present invention on the copper interconnect.

Alternative Embodiments

While the present invention is directed primarily to copper diffusion barrier films having effective dielectric constants of less than 4, a number of the multi-layer integration schemes described herein may be useful as copper barriers, etch stops, etc., in applications in which an effective dielectric constant of greater then 4 is acceptable, for example, between 4 and 4.5. Some multi-layer SiC films, particularly those which do not include undoped SiC, for example some NDC/ODC bi-layers, confer some of the integration benefits of multilayer barrier films of the present invention, even if their effective dielectric constants are not quite as low (i.e., below 4) as those barrier films incorporating UDC.

In addition, conventional tetramethylsilane (4MS) precursor may be used for one or more layers of a multi-layer film in some instances. In this case, the low-k of other high carbon-content layers in the stack (in particular, a high carbon UDC layer) may compensate for the higher k of the material formed by the 4MS (or other relatively low carbon-content) precursor so that the effective k of the film is within the desirable range.

EXAMPLES

The examples presented here are intended to better illustrate the invention as described herein and are non-limiting.

Example 1

$k_{eff}$ Simulation in Bi-Layer SiC Structure

Figure 3:
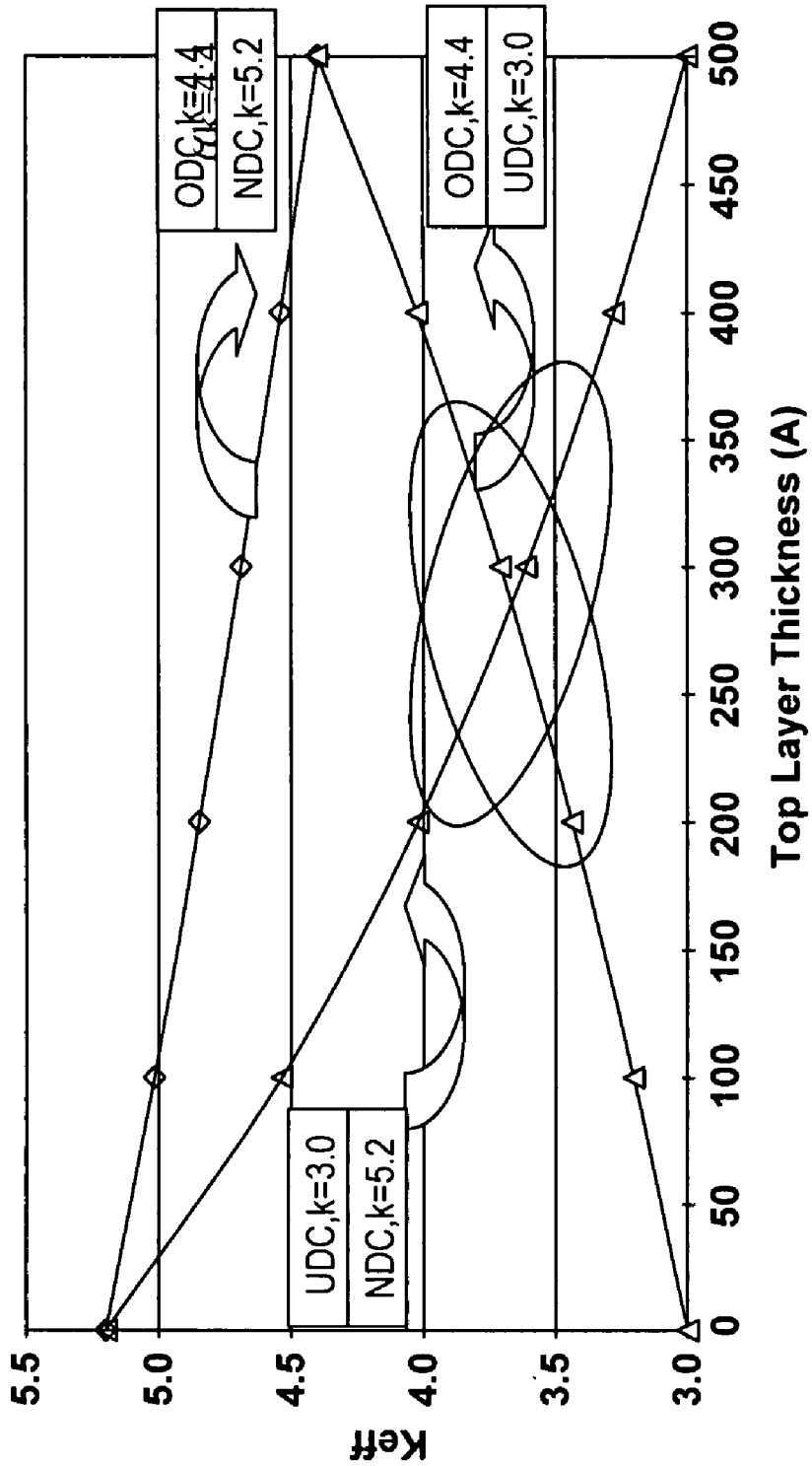
FIG. 3 is a plot of the results of a simulation conducted to determine the effective dielectric constant of various bi-layer copper diffusion barrier films in accordance with the present invention.

FIG. 3 provides a plot of the results of a simulation conducted to determine the effective dielectric constant of various bi-layer copper diffusion barrier films in accordance with the present invention. Experimental results are in excellent agreement with the target values, indicating no evidence of process induced damage. For example, 150 Å NDC/350 Å ODC gives k=3.61 and 150 Å NDC/350 Å UDC and 150 Å UDC/350 Å ODC give k=3.44 and k=3.86, respectively.

Example 2 k and Stress Drift

Figure 4:
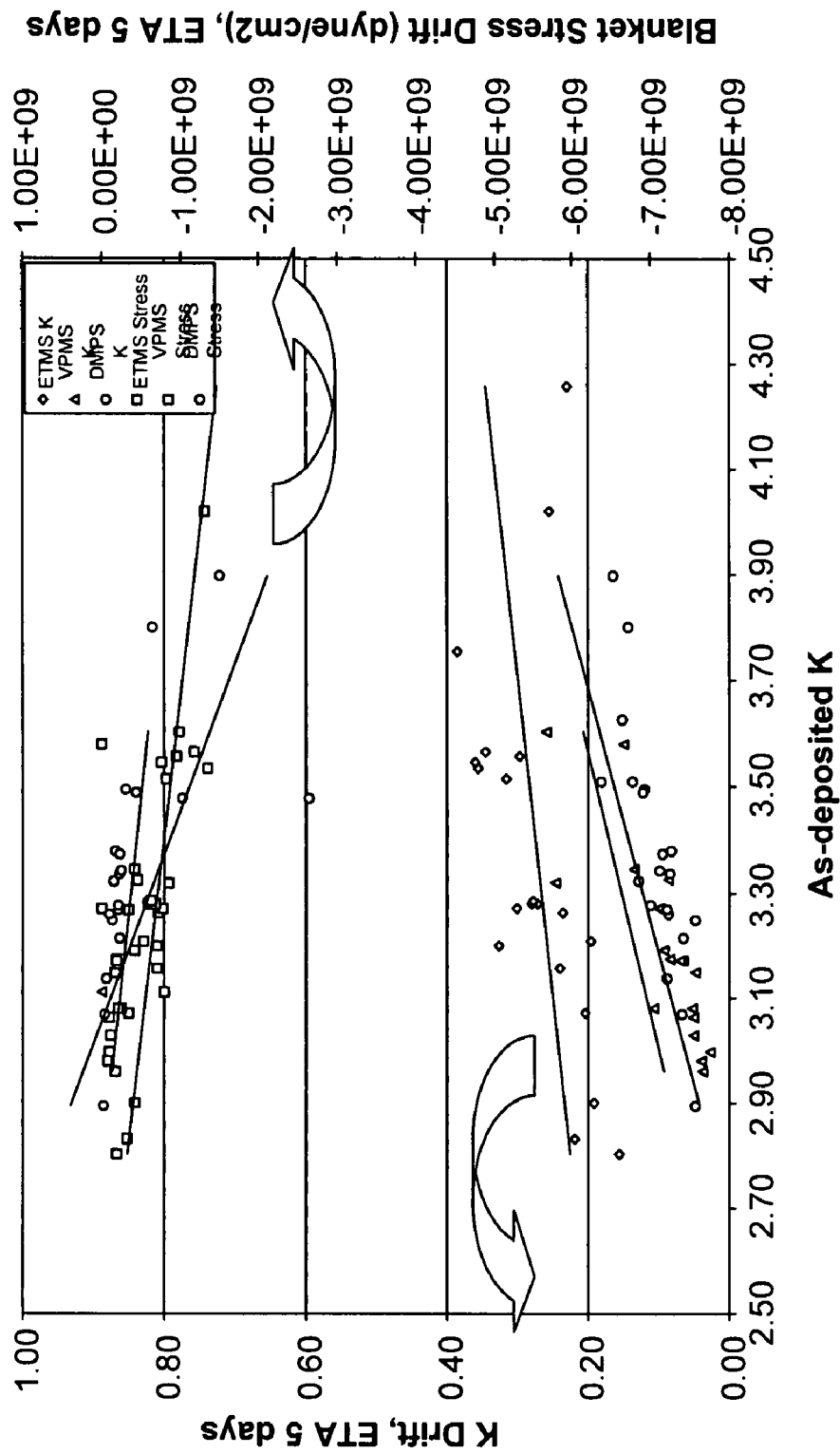
FIG. 4 is a plot of the relationship between as-deposited and actual dielectric constant (k drift) and stress drift for undoped silicon carbide copper diffusion barrier films deposited using different precursors in accordance with the present invention.

FIG. 4 provides a plot the relationship between as-deposited and actual dielectric constant (k drift) and stress drift for undoped silicon carbide copper diffusion barrier films deposited using different precursors in accordance with the present invention. The results indicate that films formed from ETMS, VPMS and DMPS precursors all have good k and stress drift performance.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

It is claimed:

1. A copper diffusion barrier film, for use in a semiconductor device, the copper diffusion barrier film comprising:
   at least one layer of undoped carbon-rich silicon carbide, the layer having a composition of at least 40 atomic % carbon (C) and a dielectric constant of less than about 4, wherein the layer is a reaction product of a plasma reaction of one or more silicon carbide precursors, wherein at least one precursor is selected from the group consisting of ethynyltrimethylsilane, tri-isopropylsilane, 3-(trimethylsilyl)cyclopentene, and vinyldimethylsilane; and
   one or more additional layers of silicon carbide forming a stack, wherein at least one of the additional layers has a dielectric constant higher than the dielectric constant of the carbon-rich silicon carbide, wherein
   the diffusion barrier film has an effective dielectric constant of less than about 4.5.

2. The copper diffusion barrier film of claim 1, wherein the film has an effective dielectric constant of less than about 4.0.

3. The copper diffusion barrier film of claim 1, wherein the film has a thickness from about 20 to 2000 Å.

4. The copper diffusion barrier film of claim 1, wherein the film has a thickness of about 500 Å.

5. The copper diffusion barrier film of claim 1, wherein the layer of undoped carbon-rich silicon carbide resides in contact with a copper line.

6. The copper diffusion barrier of claim 1, wherein the carbon-rich silicon carbide has a C to Si ratio of greater than 4:1.

7. The copper diffusion barrier film of claim 1, wherein the undoped carbon-rich silicon carbide layer contacts a copper line, and wherein the film comprises an oxygen doped silicon carbide layer stacked upon the carbon-rich silicon carbide layer.

8. The copper diffusion barrier film of claim 1, comprising a layer of nitrogen-doped silicon carbide contacting a copper line, wherein the layer of undoped carbon-rich silicon carbide is stacked upon the layer of nitrogen-doped silicon carbide.

9. The copper diffusion barrier film of claim 1, wherein the undoped carbon-rich silicon carbide layer contacts a copper line, and wherein the film comprises a nitrogen-doped silicon carbide layer stacked upon the carbon-rich silicon carbide layer.

10. A copper diffusion barrier film, for use in a semiconductor device, the copper diffusion barrier film comprising:
    at least one layer of doped carbon-rich silicon carbide, the layer having a composition of at least 40% atomic carbon (C) and a dielectric constant of less than about 4, wherein the layer is a reaction product of a plasma reaction of one or more silicon carbide precursors, wherein at least one precursor is selected from the group consisting of ethynyltrimethylsilane, tri-isopropylsilane, 3-(trimethylsilyl)cyclopentene, and vinyldimethylsilane; and
    one or more additional layers of silicon carbide forming a stack, wherein at least one of the additional layers has a dielectric constant higher than the dielectric constant of the carbon-rich silicon carbide, wherein
    the diffusion barrier film has an effective dielectric constant of less than about 4.5.

11. A copper diffusion barrier film, for use in a semiconductor device, the copper diffusion barrier film comprising:
    at least one layer of carbon-rich silicon carbide, the layer having a composition of at least 40 atomic % carbon (C) and a dielectric constant of less than about 4, wherein the layer is a reaction product of a plasma reaction of one or more silicon carbide precursors, wherein at least one precursor is selected from the group consisting of ethynyltrimethylsilane, tri-isopropylsilane, 3-(trimethylsilyl)cyclopentene, and vinyldimethylsilane.

12. A copper diffusion barrier film, for use in a semiconductor device, the copper diffusion barrier film comprising:
    at least one layer of undoped carbon-rich silicon carbide, the layer having a composition of at least 40 atomic % carbon (C) and a dielectric constant of less than about 4; and
    one or more additional layers of silicon carbide forming a stack, wherein at least one of the additional layers has a dielectric constant higher than the dielectric constant of the carbon-rich silicon carbide, wherein
    the diffusion barrier film has an effective dielectric constant of less than about 4.5, wherein the undoped carbon-rich silicon carbide layer contacts a copper line, and wherein the film comprises an oxygen-doped silicon carbide layer or a nitrogen-doped silicon carbide layer stacked upon the carbon-rich silicon carbide layer.

13. The copper diffusion barrier film of claim 12, wherein the undoped carbon-rich silicon carbide layer contacts a copper line, and wherein the film comprises an oxygen doped silicon carbide layer stacked upon the carbon-rich silicon carbide layer.

14. The copper diffusion barrier film of claim 12, wherein the undoped carbon-rich silicon carbide layer contacts a copper line, and wherein the film comprises a nitrogen-doped silicon carbide layer stacked upon the carbon-rich silicon carbide layer.

\* \* \* \* \*